US009023667B2

(12) United States Patent
Iravani et al.

(10) Patent No.: US 9,023,667 B2
(45) Date of Patent: May 5, 2015

(54) HIGH SENSITIVITY EDDY CURRENT MONITORING SYSTEM

(75) Inventors: Hassan G. Iravani, San Jose, CA (US); Kun Xu, Sunol, CA (US); Boguslaw A. Swedek, Cupertino, CA (US); Ingemar Carlsson, Milpitas, CA (US); Shih-Haur Shen, Sunnyvale, CA (US); Wen-Chiang Tu, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 310 days.

(21) Appl. No.: 13/095,818

(22) Filed: Apr. 27, 2011

(65) Prior Publication Data

US 2012/0276661 A1    Nov. 1, 2012

(51) Int. Cl.
H01L 21/66 (2006.01)
B24B 51/00 (2006.01)
B24B 49/10 (2006.01)

(52) U.S. Cl.
CPC ............... H01L 22/14 (2013.01); H01L 22/26 (2013.01); B24B 49/105 (2013.01); H01L 2924/0002 (2013.01)

(58) Field of Classification Search
None
See application file for complete search history.

(56) References Cited

U.S. PATENT DOCUMENTS

| 4,000,458 | A | 12/1976 | Miller et al. |
| 5,343,146 | A | 8/1994 | Koch et al. |
| 5,738,574 | A | 4/1998 | Tolles et al. |
| 6,159,073 | A | 12/2000 | Wiswesser et al. |
| 6,280,289 | B1 | 8/2001 | Wiswesser et al. |
| 6,399,501 | B2 | 6/2002 | Birang et al. |
| 6,924,641 | B1 | 8/2005 | Hanawa et al. |
| 7,112,960 | B2 | 9/2006 | Miller et al. |
| 7,128,803 | B2 | 10/2006 | Owczarz et al. |
| 7,654,888 | B2 | 2/2010 | Zuniga et al. |
| 2002/0055192 | A1 | 5/2002 | Redeker et al. |
| 2005/0337015 | | 8/2004 | Naftali et al. |
| 2005/0020185 | A1 | 1/2005 | Zuniga et al. |
| 2005/0024047 | A1 * | 2/2005 | Miller et al. ................. 324/231 |
| 2006/0021974 | A1 | 2/2006 | Liu et al. |
| 2007/0139043 | A1 | 6/2007 | Miller et al. |
| 2010/0124792 | A1 | 5/2010 | Iravani et al. |
| 2011/0189925 | A1 | 8/2011 | Iravani et al. |

OTHER PUBLICATIONS

International Search Report/Written Opinion for corresponding application PCT/US2012/034590 dated Nov. 1, 2012.

* cited by examiner

*Primary Examiner* — Seahvosh Nikmanesh
(74) *Attorney, Agent, or Firm* — Fish & Richardson P.C.

(57) ABSTRACT

A method of chemical mechanical polishing a substrate includes polishing a metal layer on the substrate at a polishing station, monitoring thickness of the metal layer during polishing at the polishing station with an eddy current monitoring system, and controlling pressures applied by a carrier head to the substrate during polishing of the metal layer at the polishing station based on thickness measurements of the metal layer from the eddy current monitoring system to reduce differences between an expected thickness profile of the metal layer and a target profile, wherein the metal layer has a resistivity greater than 700 ohm Angstroms.

13 Claims, 11 Drawing Sheets

HIGH SENSITIVITY EDDY CURRENT MONITORING SYSTEM

TECHNICAL FIELD

The present disclosure relates to eddy current monitoring during chemical mechanical polishing of substrates.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, a method of chemical mechanical polishing a substrate includes polishing a metal layer on the substrate at a polishing station, monitoring thickness of the metal layer during polishing at the polishing station with an eddy current monitoring system, and controlling pressures applied by a carrier head to the substrate during polishing of the metal layer at the polishing station based on thickness measurements of the metal layer from the eddy current monitoring system to reduce differences between an expected thickness profile of the metal layer and a target profile, wherein the metal layer has a resistivity greater than 700 ohm Angstroms.

Implementations may include one or more of the following features. The target profile may be a planar profile and reducing differences may improve thickness uniformity of the metal layer. The metal layer may have a resistivity less than 10000 ohm Angstroms. Polishing may be halted when the eddy current monitoring system indicates that a predetermined thickness of the metal layer remains on the substrate. The eddy current monitoring system may have a resonant frequency greater than 12 MHz, e.g., between about 14 and 16 MHz. The metal may be cobalt, titanium, or metallic titanium nitride. Polishing of the metal layer may be monitored without an optical monitoring system.

In another aspect, an apparatus for chemical mechanical polishing includes a platen having a surface to support a polishing pad, and an eddy current monitoring system to generate an eddy current signal. The eddy current monitoring system includes a core positioned at least partially in the platen and a coil wound around a portion of the core. The core includes a back portion, a first prong extending from the back portion in a first direction normal to the surface of the platen and having a width in a second direction parallel to the surface of the platen, and second and third prongs extending from the back portion in parallel with the first protrusion, the second and third prongs positioned on opposite sides of and equidistant from the first prong. The coil and core are configured to provide a resonant frequency of at least 12 MHz.

Implementations may include one or more of the following features. The coil and core may be configured to provide a resonant frequency between about 14 and 16 MHz. A thickness of each of the second and third prongs may be approximately equal to half the width of the first prong. A spacing in the second direction between each of the second and third prongs and the first prong may be approximately equal to two-thirds the width of the three prongs combined. The first, second, and third prongs may have a height equal to a spacing between the first and second prongs. The height of the first, second, and third prongs may be equal to a thickness of the back portion. The coil may be wound only around the first prong. The coil may be wound about 3 times around the first prong. A capacitor may be in parallel with the coil. The capacitor may have a capacitance of about 150 pF. The core may be nickel zinc ferrite.

Certain implementations can include one or more of the following advantages. The thickness of lower conductance metals, e.g., titanium or cobalt, can be sensed during bulk polishing, permitting closed loop control of carrier head pressure and thus improved within-wafer non-uniformity (WIWNU) and wafer-to-wafer non-uniformity (WTWNU). The removal of metal residue can be sensed, e.g., for copper residue, and this permits more accurate endpoint control and reduces the need for deliberate overpolishing. The thickness (or conductivity) of metal lines, e.g., copper lines, can be sensed, permitting closed loop control of carrier head pressure to drive to uniform metal line thickness and conductivity, which can provide improved yield. During polishing of metal pillars, e.g., copper pillars, planarization of the pillars can be detected, thus providing endpoint control of the planarization process.

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

CMP systems can use eddy current monitoring systems to detect thickness of a top metal layer on a substrate. During polishing of the top metal layer, the eddy current monitoring system can determine the thickness of different regions of the metal layer on the substrate. The thickness measurements can be used to adjust processing parameters of the polishing process in real time. For example, a substrate carrier head can adjust the pressure on the backside of the substrate to increase or decrease the polishing rate of the regions of the metal layer. The polishing rate can be adjusted so that the regions of the metal layer are substantially the same thickness after polishing. The CMP system can adjust the polishing rate so that polishing of the regions of the metal layer completes at about the same time. Such profile control can be referred to as real time profile control (RTPC).

One problem with eddy current monitoring is an insufficient signal for accurate thickness determination, which can result in lack of accuracy in endpoint determination and profile control. Without being limited to any particular theory, a factor that contributes to an insufficient signal can include polishing of lower conductivity metals, e.g., cobalt, titanium or titanium nitride.

Signal strength can be improved by proper configuration of the sensor.

By raising the resonant frequency, the signal strength can be increased to perform reliable profile control for metals with a resistivity greater than 700 ohm Angstroms, e.g., greater than 1500 ohm Angstroms. Such metals can include cobalt, titanium, and titanium nitride.

Further, the eddy current monitoring system can also be used to detect removal of metal residue, e.g., residue of higher conductivity metals, e.g., copper, aluminum or tungsten, from the surface of the substrate and exposure of an underlying dielectric layer. features in an underlying layer of the substrate. Further, the eddy current monitoring system can also be used to detect thickness of metal features on the substrate. Such features can include copper, aluminum, or tungsten in trenches, and potentially in pillars. In addition, the eddy current monitoring system can also be used to detect planarization of metal pillars, e.g., pillars of higher conductivity metal, e.g., copper. The resonant frequency can be raised by adjusting parameters including the material of the sensor core, the number of windings of the coil around the center prong, and a capacitance of a capacitor placed on a circuit in parallel with the coil.

Figure 1:
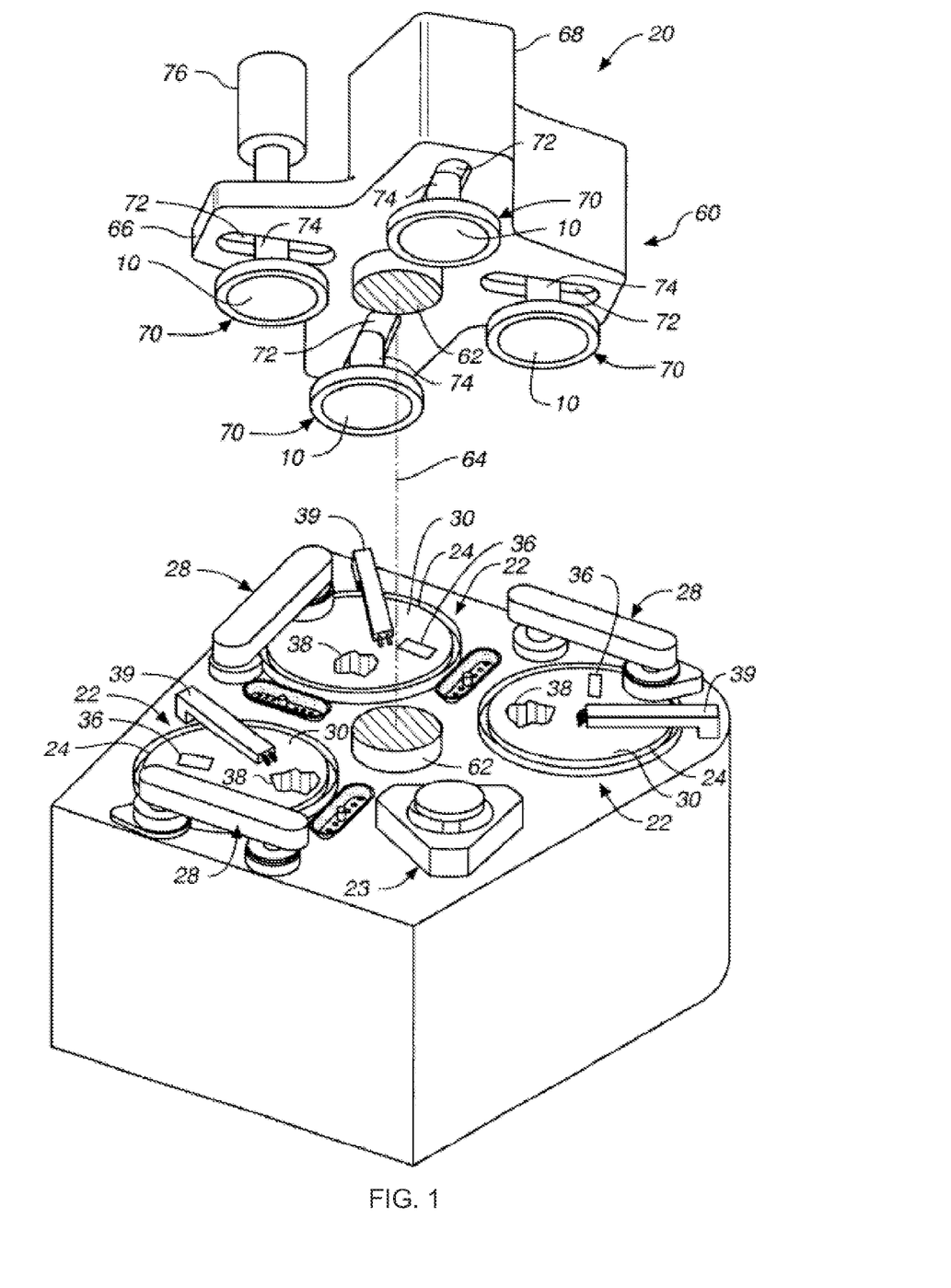
FIG. 1 is a schematic exploded perspective view of a chemical mechanical polishing apparatus.

FIG. 1 shows a CMP apparatus 20 for polishing one or more substrates 10. A description of a similar polishing apparatus can be found in U.S. Pat. No. 5,738,574. Polishing apparatus 20 includes a series of polishing stations 22a, 22b and 22c, and a transfer station 23. Transfer station 23 transfers the substrates between the carrier heads and a loading apparatus.

Each polishing station includes a rotatable platen 24 having a top surface 25 on which is placed a polishing pad 30. The first and second stations 22a and 22b can include a two-layer polishing pad with a hard durable outer surface or a fixed-abrasive pad with embedded abrasive particles. The final polishing station 22c can include a relatively soft pad or a two-layer pad. Each polishing station can also include a pad conditioner apparatus 28 to maintain the condition of the polishing pad so that it will effectively polish substrates.

Figure 2:
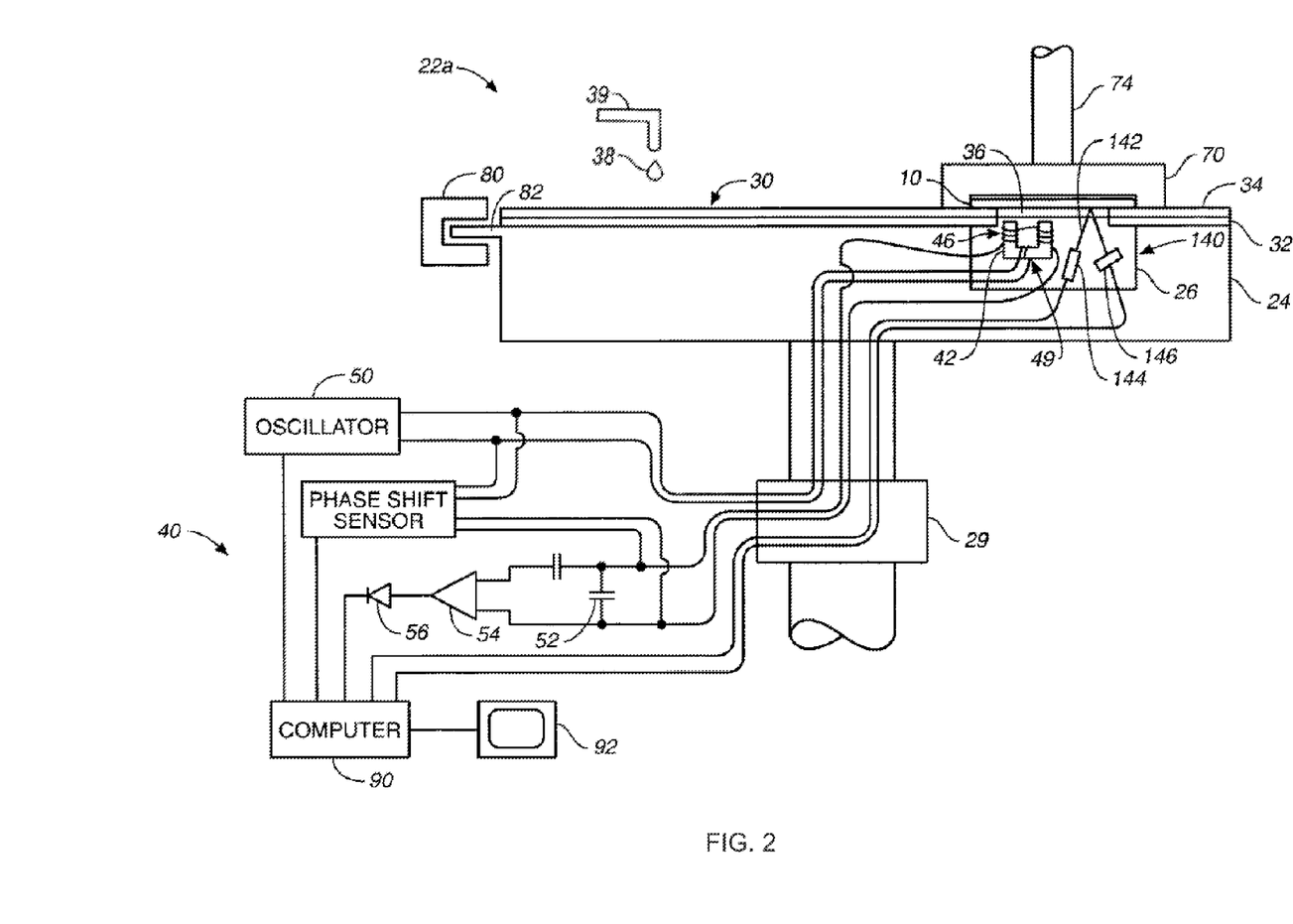
FIG. 2 is a schematic side view, partially cross-sectional, of a chemical mechanical polishing station that includes an eddy current monitoring system and an optical monitoring system.

Referring to FIG. 2, a two-layer polishing pad 30 typically has a backing layer 32 which abuts the surface of platen 24 and a covering layer 34 which is used to polish substrate 10. Covering layer 34 is typically harder than backing layer 32. However, some pads have only a covering layer and no backing layer. Covering layer 34 can be composed of foamed or cast polyurethane, possibly with fillers, e.g., hollow microspheres, and/or a grooved surface. Backing layer 32 can be composed of compressed felt fibers leached with urethane. A two-layer polishing pad, with the covering layer composed of IC-1000 and the backing layer composed of SUBA-4, is available from Rodel, Inc., of Newark, Del. (IC-1000 and SUBA-4 are product names of Rodel, Inc.).

During a polishing step, a slurry 38 can be supplied to the surface of polishing pad 30 by a slurry supply port or combined slurry/rinse arm 39. If polishing pad 30 is a standard pad, slurry 38 can also include abrasive particles (e.g., silicon dioxide for oxide polishing).

Returning to FIG. 1, a rotatable multi-head carousel 60 supports four carrier heads 70. The carousel is rotated by a central post 62 about a carousel axis 64 by a carousel motor assembly (not shown) to orbit the carrier head systems and the substrates attached thereto between polishing stations 22 and transfer station 23. Three of the carrier head systems receive and hold substrates, and polish them by pressing them against the polishing pads. Meanwhile, one of the carrier head systems receives a substrate from and delivers a substrate to transfer station 23.

Each carrier head 70 is connected by a carrier drive shaft 74 to a carrier head rotation motor 76 (shown by the removal of one quarter of cover 68) so that each carrier head can independently rotate about it own axis. In addition, each carrier head 70 independently laterally oscillates in a radial slot 72 formed in carousel support plate 66. A description of a suitable carrier head 70 can be found in U.S. Pat. No. 7,654,888, the entire disclosure of which is incorporated by reference. In operation, the platen is rotated about its central axis 25, and the carrier head is rotated about its central axis 71 and translated laterally across the surface of the polishing pad.

Figure 3:
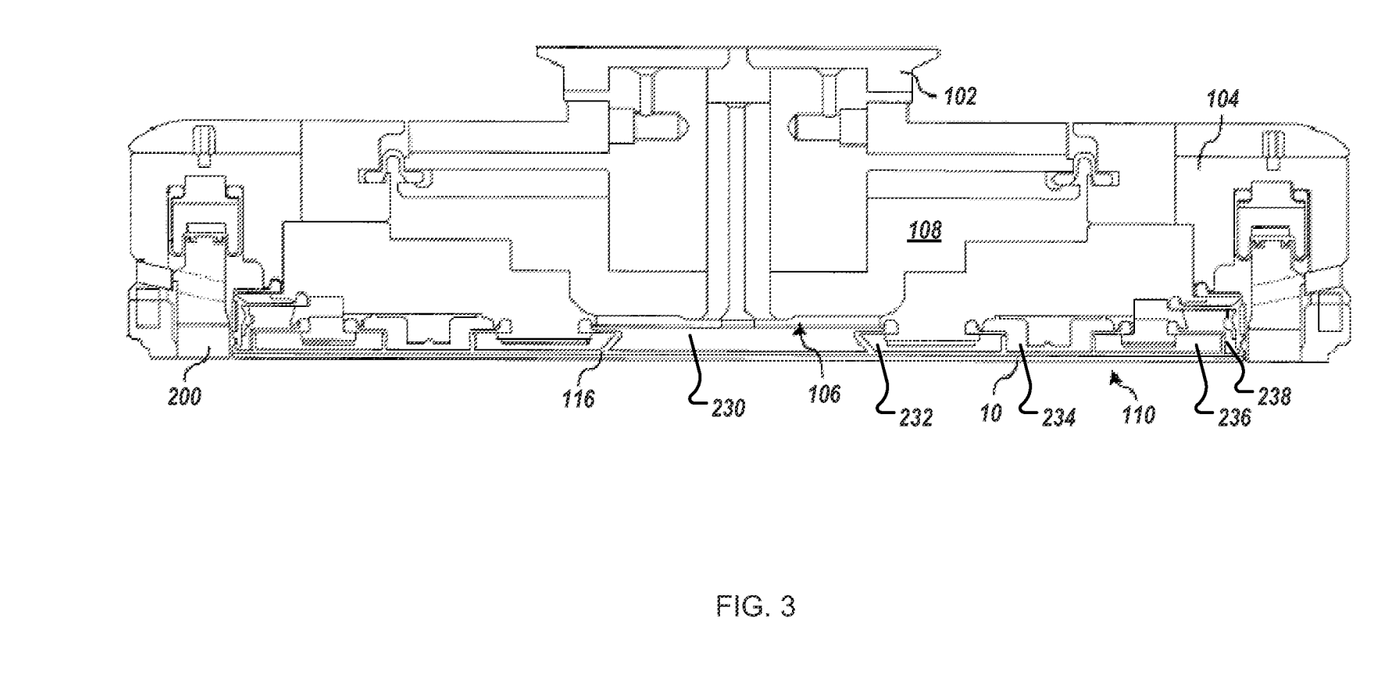
FIG. 3 is a schematic cross-sectional view of a carrier head.

FIG. 3 shows one of the carrier heads 70. Each of the carrier heads 70 includes a housing 102, a base assembly 104, a gimbal mechanism 106 (which can be considered part of the base assembly 104), a loading chamber 108, a retaining ring 200, and a substrate backing assembly 110 which includes a flexible membrane 116 that defines multiple independently pressurizable chambers, such as an inner chamber 230, middle chambers 232, 234, 236, and an outer chamber 238. These chambers control the pressure on concentric regions of the flexible membrane, thus providing independent pressure control on concentric portions of the substrate. In some implementations, each of the carrier heads 70 includes five chambers and a pressure regulator for each of the chambers.

Returning to FIG. 2, the eddy current monitoring system 40 includes a drive system to induce eddy currents in a metal layer on the substrate and a sensing system to detect eddy currents induced in the metal layer by the drive system. The monitoring system 40 includes a core 42 positioned in recess 26 to rotate with the platen, a drive coil 49 wound around one part of core 42, and a sense coil 46 wound around second part of core 42. For the drive system, monitoring system 40 includes an oscillator 50 connected to drive coil 49. For the sense system, monitoring system 40 includes a capacitor 52 connected in parallel with sense coil 46, an RF amplifier 54 connected to sense coil 46, and a diode 56. The oscillator 50, capacitor 52, RF amplifier 54, and diode 56 can be located apart from platen 24, and can be coupled to the components in the platen through a rotary electrical union 29.

In some implementations, the backing layer 32 includes an aperture above the recess 26. The aperture can have the same width and depth as the recess 26. Alternatively, the aperture can be smaller than the recess 26. A portion 36 of the covering layer 34 can be above the aperture in the backing layer. The portion 36 of the covering layer 34 can prevent the slurry 38 from entering the recess 26. Part of the core 42 can be located in the aperture. For example, the core 42 can include prongs that extend into the aperture. In some implementations, the top of the core 42 does not extend past the bottom surface of the covering layer 34.

In operation the oscillator 50 drives drive coil 49 to generate an oscillating magnetic field that extends through the body of core 42 and into the gap between the prongs of the core. At least a portion of magnetic field extends through thin portion 36 of polishing pad 30 and into substrate 10. If a metal layer is present on substrate 10, oscillating magnetic field generates eddy currents in the metal layer. The eddy currents cause the metal layer to act as an impedance source in parallel with sense coil 46 and capacitor 52. As the thickness of the metal layer changes, the impedance changes, resulting in a change in the Q-factor of sensing mechanism. By detecting the change in the Q-factor of the sensing mechanism, the eddy current sensor can sense the change in the strength of the eddy currents, and thus the change in thickness of metal layer.

An optical monitoring system 140, which can function as a reflectometer or interferometer, can be secured to platen 24 in recess 26, e.g., adjacent the eddy current monitoring system 40. Thus, the optical monitoring system 140 can measure the reflectivity of substantially the same location on the substrate as is being monitored by the eddy current monitoring system 40. Specifically, the optical monitoring system 140 can be positioned to measure a portion of the substrate at the same radial distance from the axis of rotation of the platen 24 as the eddy current monitoring system 40. Thus, the optical monitoring system 140 can sweep across the substrate in the same path as the eddy current monitoring system 40.

The optical monitoring system 140 includes a light source 144 and a detector 146. The light source generates a light beam 142 which propagates through transparent window section 36 and slurry to impinge upon the exposed surface of the substrate 10. For example, the light source 144 may be a laser and the light beam 142 may be a collimated laser beam. The light laser beam 142 can be projected from the laser 144 at an angle $\alpha$ from an axis normal to the surface of the substrate 10. In addition, if the recess 26 and the window 36 are elongated, a beam expander (not illustrated) may be positioned in the path of the light beam to expand the light beam along the elongated axis of the window. In general, the optical monitoring system functions as described in U.S. Pat. Nos. 6,159, 073, and 6,280,289, the entire disclosures of which are incorporated herein by references. In some implementations, the eddy current monitoring system 40 is sensitive enough that the optical monitoring system 140 can be not included.

The CMP apparatus 20 can also include a position sensor 80, such as an optical interrupter, to sense when core 42 and light source 44 are beneath substrate 10. For example, the optical interrupter could be mounted at a fixed point opposite carrier head 70. A flag 82 is attached to the periphery of the platen. The point of attachment and length of flag 82 is selected so that it interrupts the optical signal of sensor 80 while transparent section 36 sweeps beneath substrate 10. Alternately, the CMP apparatus can include an encoder to determine the angular position of platen.

A general purpose programmable digital computer 90 receives the intensity signals from the eddy current sensing system, and the intensity signals from the optical monitoring system. Since the monitoring systems sweep beneath the substrate with each rotation of the platen, information on the metal layer thickness and exposure of the underlying layer is accumulated in-situ and on a continuous real-time basis (once per platen rotation). The computer 90 can be programmed to sample measurements from the monitoring system when the substrate generally overlies the transparent section 36 (as determined by the position sensor). As polishing progresses, the reflectivity or thickness of the metal layer changes, and the sampled signals vary with time. The time varying sampled signals may be referred to as traces. The measurements from the monitoring systems can be displayed on an output device 92 during polishing to permit the operator of the device to visually monitor the progress of the polishing operation.

In operation, the CMP apparatus 20 uses eddy current monitoring system 40 and optical monitoring system 140 to determine when the bulk of the filler layer has been removed and to determine when the underlying stop layer has been substantially exposed. The computer 90 applies process control and endpoint detection logic to the sampled signals to determine when to change process parameter and to detect the polishing endpoint. Possible process control and endpoint criteria for the detector logic include local minima or maxima, changes in slope, threshold values in amplitude or slope, or combinations thereof.

In addition, the computer 90 can be programmed to divide the measurements from both the eddy current monitoring system 40 and the optical monitoring system 140 from each sweep beneath the substrate into a plurality of sampling zones, to calculate the radial position of each sampling zone, to sort the amplitude measurements into radial ranges, to determine minimum, maximum and average measurements for each sampling zone, and to use multiple radial ranges to determine the polishing endpoint, as discussed in U.S. Pat. No. 6,399,501, the entirety of which is incorporated herein by reference.

Computer 90 may also be connected to the pressure mechanisms that control the pressure applied by carrier head 70, to carrier head rotation motor 76 to control the carrier head rotation rate, to the platen rotation motor (not shown) to control the platen rotation rate, or to slurry distribution system 39 to control the slurry composition supplied to the polishing pad. Specifically, after sorting the measurements into radial ranges, information on the metal film thickness can be fed in real-time into a closed-loop controller to periodically or continuously modify the polishing pressure profile applied by a carrier head, as discussed further below.

Figure 4A:
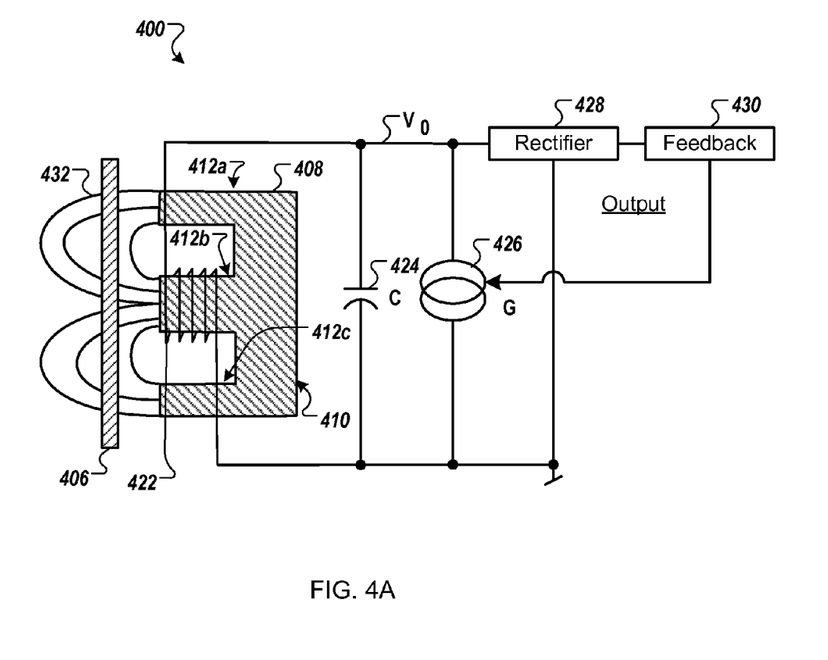
FIGS. 4A-4B show a schematic diagram of an eddy current monitoring system.

FIG. 4A shows an example of an eddy current monitoring system 400 for measuring profile information. The eddy current monitoring system 400 can be used as the eddy current monitoring system 40. With eddy current sensing, an oscillating magnetic field induces eddy currents in a conductive region on the wafer. The eddy currents are induced in a region that is coupled with magnetic flux lines generated by the eddy current sensing system. The eddy current monitoring system 400 includes a core 408 with an E-shaped body. The core 408 can include a back portion 410 and three prongs 412a-c extending from the back portion 410.

The back portion 410 of the core 408 can be a generally plate-shape or rectangular box-shaped body, and can have a top face parallel to the top surface of the platen, e.g., parallel to the substrate and the polishing pad during the polishing operation. In some implementations, the long axis of the back portion 410 is perpendicular to a radius of the platen that extends from the axis of rotation of the platen. The long axis of the back portion 410 can be normal to the front face of the back portion 410. The back portion 410 can have a height that is measured normal to the top surface of the platen.

The prongs 412a-c extend from the back portion 410 in a direction normal to a top surface of the back portion 410 and are substantially linear and extend in parallel with each other. Each of the prongs 412a-c can have a long axis along a direction parallel to the top surface of the platen, e.g., parallel to the faces of the substrate and polishing pad during the polishing operation, and are substantially linear and extend in parallel to each other. The long axes of the prongs 412a-c can be normal to the front face of the prongs 412a-c. The long axis of the back portion 410 can extend in the same direction as the long axes of the prongs 412a-c. In some implementations, the long axes of the prongs 412a-c are perpendicular to a radius of the polishing pad that extends from the axis of rotation of the polishing pad. The two outer prongs 412a, 412c are on opposite sides of the middle prong 412b. The space between the each of the outer prongs (e.g., 412a and 412c) and the center prong (e.g., 412b) can be the same, i.e., the outer prongs 412a, 412c can be equidistant from the middle prong 412b.

The eddy current sensing system 400 includes a coil 422 and a capacitor 424 in parallel. The coil 422 can be coupled with the core 408 (e.g., the coil 422 can be wrapped around the center prong 412b). Together the coil 422 and the capacitor 424 can form an LC resonant tank. In operation, a current generator 426 (e.g., a current generator based on a marginal oscillator circuit) drives the system at the resonant frequency of the LC tank circuit formed by the coil 422 (with inductance L) and the capacitor 424 (with capacitance C). The current generator 426 can be designed to maintain the peak to peak amplitude of the sinusoidal oscillation at a constant value. A time-dependent voltage with amplitude V0 is rectified using a rectifier 428 and provided to a feedback circuit 430. The feedback circuit 430 determines a drive current for current generator 426 to keep the amplitude of the voltage V0 constant. For such a system, the magnitude of the drive current can be proportional to the conducting film thickness. Marginal oscillator circuits and feedback circuits are further described in U.S. Pat. Nos. 4,000,458, and 7,112,960 which are incorporated by reference.

The current generator 426 can feed current to the LC resonant tank in order for the frequency to remain the same. The coil 422 can generate an oscillating magnetic field 432, which may couple with a conductive region 406 of the substrate (e.g., the substrate 10). When the conductive region 406 is present, the energy dissipated as eddy currents in the substrate can bring down the amplitude of the oscillation. The current generator 426 can feed more current to the LC resonant tank to keep the amplitude constant. The amount of additional current fed by the current generator 426 can be sensed and can be translated into a thickness measurement of the conductive region 406.

Figure 4B:
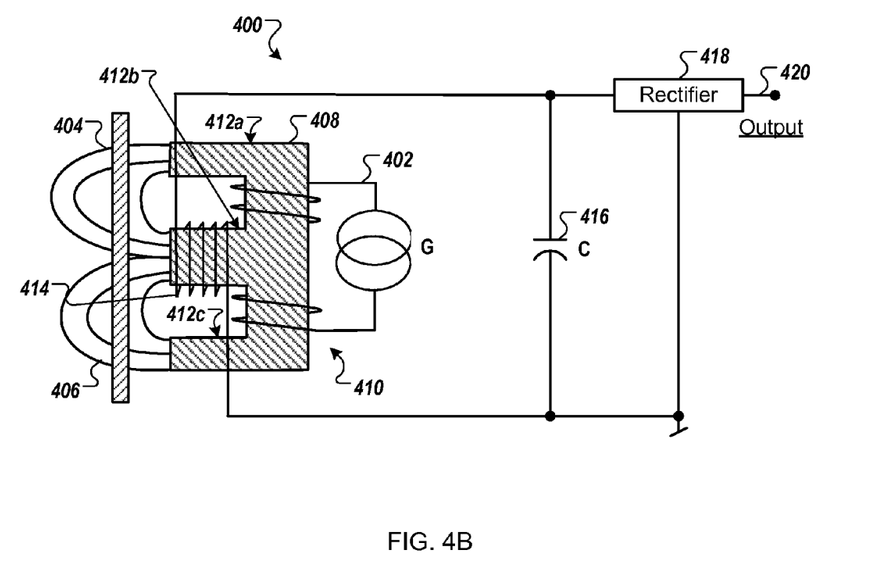

FIG. 4B shows another implementation of an eddy current monitoring system 400. The eddy current monitoring system 400 can include a drive coil 402 for generating an oscillating magnetic field 404, which may couple with the conductive region 406 of interest (e.g., a portion of a metal layer on a semiconductor wafer). Drive coil 402 can be wound around the back portion 410. The oscillating magnetic field 404 generates eddy currents locally in conductive region 406. The eddy currents cause conductive region 406 to act as an impedance source in parallel with a sense coil 414 and a capacitor 416. The sense coil 414 can be wrapped around the center prong 412b. The sense coil 414 can be wrapped around an outer portion of the center prong 412b to increase the sensitivity of the eddy current monitoring system 400. As the thickness of conductive region 406 changes, the impedance changes, resulting in a change in the Q-factor of the system. By detecting the change in the Q-factor, the eddy current monitoring system 400 can sense the change in the strength of the eddy currents, and thus the change in thickness of the conductive region. Therefore, the eddy current monitoring system 400 can be used to determine parameters of the conductive region, such as a thickness of the conductive region, or may be used to determine related parameters, such as a polishing endpoint. Note that although the thickness of a particular conductive region is discussed above, the relative position of core 408 and the conductive layer may change, so that thickness information for a number of different conductive regions is obtained.

In some implementations, a change in Q-factor may be determined by measuring an amplitude of current in the sense coil as a function of time, for a fixed drive frequency and drive amplitude. An eddy current signal may be rectified using a rectifier 418, and the amplitude monitored via an output 420. Alternately, a change in Q-factor may be determined by measuring an phase difference between the drive signal and the sense signal as a function of time.

The eddy current monitoring system 400 can be used to measure the thickness of a conductive layer on a substrate. In some implementations, an eddy current monitoring system with a higher signal strength, a higher signal to noise ratio and/or improved spatial resolution and linearity may be desired. For example, in RTPC applications, obtaining desired cross-wafer uniformity may require an improved eddy current sensing system.

The eddy current monitoring system 400 can provide enhanced signal strength, signal to noise ratio, enhanced linearity, and enhanced stability. Additional benefits may be obtained by providing an eddy current sensing system with improved signal strength. Improved signal strength may be particularly beneficial for RTPC. Obtaining high resolution wafer profile information allows for more accurate adjustment of processing parameters, and thus may enable fabrication of devices with smaller critical dimensions (CDs).

In general, the in-situ eddy current monitoring system 400 is constructed with a resonant frequency of about 50 kHz to 20 MHz, e.g., between about 10 and 20 MHz, e.g., between about 14 and 16 MHz. For example, for the eddy current monitoring system 400 shown in FIG. 4A, the coil 422 can have an inductance of about 0.3 to 30 microH, e.g., 0.75 uH, and the capacitor 424 can have a capacitance of about 70 pF to about 0.022 uF, e.g., 150 pF.

Figure 5A:
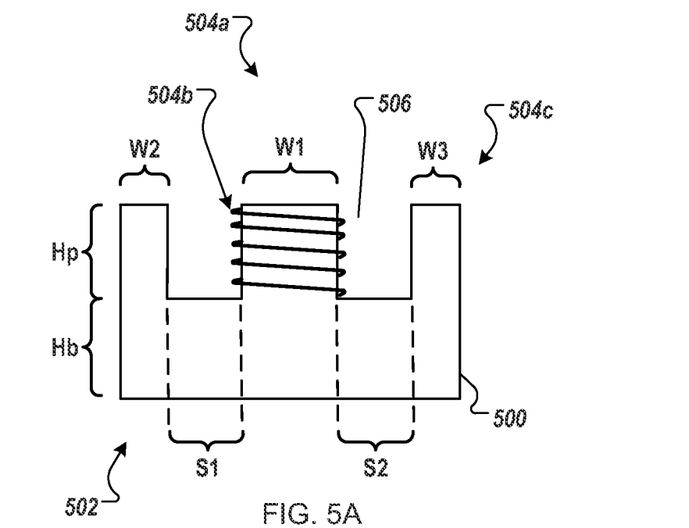
FIGS. 5A and 5B show side and perspective views of an eddy current monitoring system with three prongs.

FIG. 5A shows another example of a core 500. The core 500 can have an E-shaped body formed of a non-conductive material with a relatively high magnetic permeability (e.g., μ of about 2500 or more). Specifically, core 500 can be nickel-zinc ferrite. The core 500 can be coated. For example, the core 500 can be coated with a material such as parylene to prevent water from entering pores in the core 500, and to prevent coil shorting. The core 500 can be the same as the core 408 included in the eddy current monitoring system 400. The core 500 can include a back portion 502 and three prongs 504a-c extending from the back portion 502.

The first prong 504b has a width W1, the second prong 504a has a width W2, and the third prong 504c has a width W3. The widths W2 and W3 can be the same. For example, the prongs 504a and 504c can have a width of 0.75 mm. The width of prong 504b, or W1, can be twice the width of either prong 504a or 504c, or 1.5 mm. The first prong 504b and the second prong 504a are a separated by a distance S1, and the first prong 504b and the third prong 504c are a distance S2 apart. In some implementations, the distances S1 and S2 are the same and the second prong 504a and the third prong 504c are the same distance from the center prong 504b. For example, both the distances S1 and S2 can be about 2 mm.

Each of the prongs 504a-c has a height Hp, which is the distance that the prongs 504a-c extends from the back portion 502 of the core 500. The height Hp can be greater than the widths W1, W2, and W3. In some implementations, the height Hp is the same as the distances S1 and S2 separating the prongs 504a-c. In particular, the height Hp can be 2 mm. The back portion 502 has a height Hb. The height Hb can be the same as the distance S1 or the distance S2 or the height Hp, e.g., 2 mm.

A coil 506 can be wound around the center prong 504b. The coil can be coupled with a capacitor, such as the capacitor 416. In implementations of eddy current monitoring systems such as the system 400, separate sense and drive coils can be used. In some implementations, a coil such as the coil 506 may be litz wire (woven wire constructed of individual film insulated wires bunched or braided together in a uniform pattern of twists and length of lay), which may be less lossy than solid wire for the frequencies commonly used in eddy current sensing.

In some implementations, the coil 506 can be wrapped around a portion of the center prong 504b and not the entire prong 504b. For example, the coil 506 can be wrapped around an outer portion of the center prong 504b. The coil 506 may not touch an inner portion of the center prong 504b. The inner portion can be closer to the back portion 502 than the outer portion.

Figure 5B:
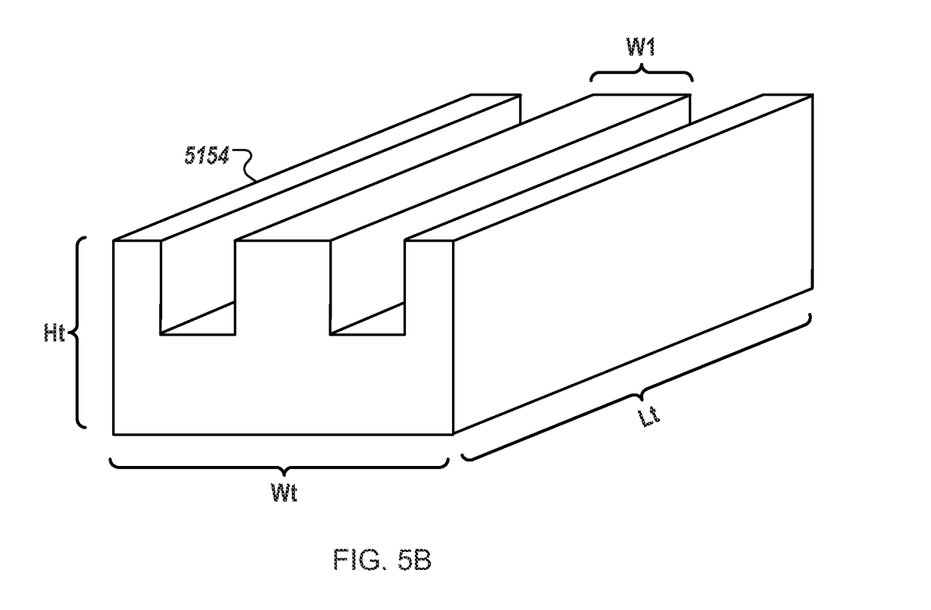

FIG. 5B shows a perspective view of the core 500. The core 500 can have a width Wt that is the sum of the widths W1, W2, and W3 of the prongs 504a-c and the distances S1 and S2 separating the prongs 504a-c. The core 500 has a height Ht that is the sum of the height Hp of the prongs 504a-c and the height Hb of the back portion 502. In some implementations, the width Wt is greater than the height Ht. The core 500 has a length Lt that is greater than the width W1 of the center prong 504b, and preferably greater than the width Wt of the core. The length Lt can be between about 10 and 30 mm. The length Lt can be greater than the width Wt of the core 500.

Figure 6A:
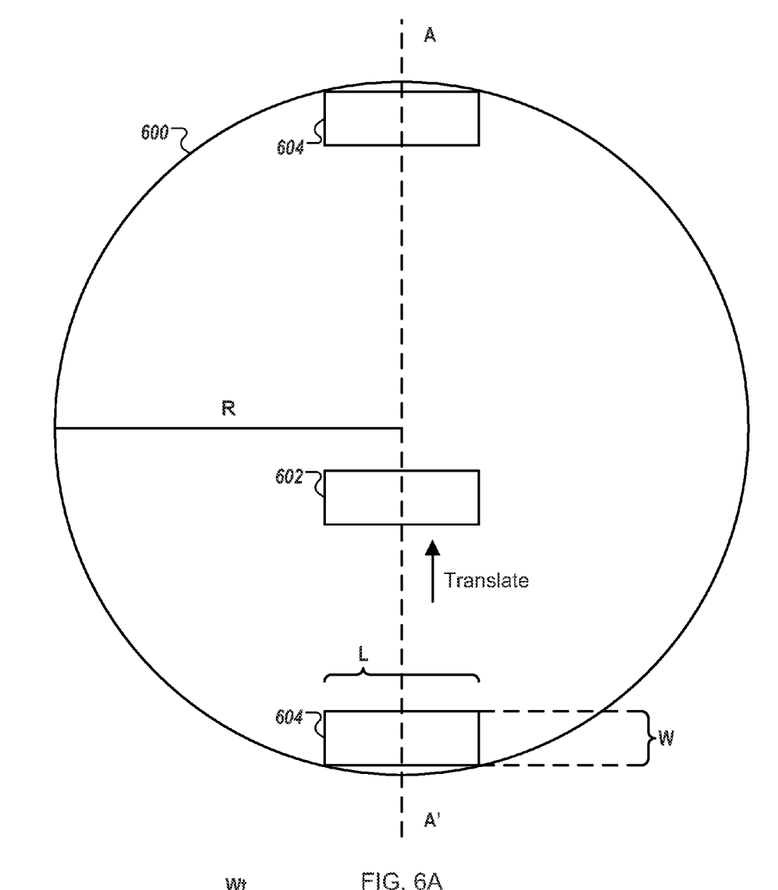
FIGS. 6A and 6B show top and side views of a chemical mechanical polishing apparatus using an elongated core.
Figure 6B:
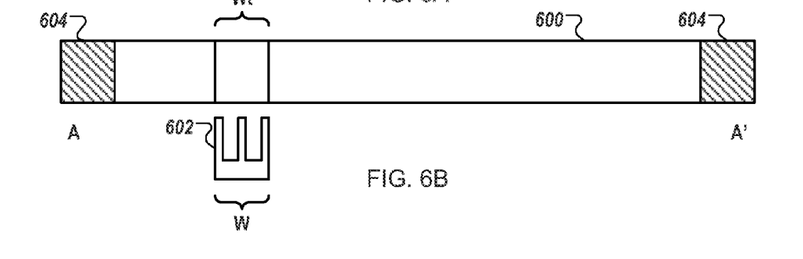

FIGS. 6A and 6B show top and side views of the relative position of a substrate 600 with respect to a core 602 (which may be similar to core 408 of FIG. 4 or core 500 of FIG. 5). For a scan through a slice A-A' through the center of the wafer 600 having a radius R, the core 602 is oriented so that its long axis is perpendicular to a radius of the wafer 600. The core 602 is translated relative to the diameter of the wafer as shown. Note that the magnetic field produced by a coil wound around the core 602 induces eddy currents in a conductive region that is elongated in shape as well, with a length greater than a width. However, the length and the width are generally not the same as the length and width of the core 602, and the aspect ratio and cross section of the conductive region is generally different than that of the core 602 as well.

Although the configuration of FIGS. 6A and 6B may provide improved resolution for most of slide A-A' of the wafer 600, as the core 602 translates along a first and last segments 604 of the radius, a portion of the core 602 is not proximate to the substrate. Therefore the measurement for the segments 604 is less accurate and may place a limit on the maximum desirable length L, such as the length Lt, of the core 602. Additionally, as the core 602 approaches the center of the wafer 600, the core 602 is sampling a larger radial range. Therefore, the spatial resolution for a particular radial distance r≈R is significantly better than the spatial resolution of r≈0.

As explained above, the length L of the core 602 is greater than its width W. That is, the aspect ratio L/W is greater than one. Different values for L, W, and L/W may be used for different implementations. For example, W may range from a fraction of a millimeter to more than a centimeter, while L may range from about a millimeter (for smaller values of W) to ten centimeters or greater.

In a particular implementation, W is between about a millimeter and about ten millimeters, while L is between about one centimeter to about five centimeters. More particularly, the core 602 may be about seven millimeters wide, with each protrusion being about a millimeter in width and with each space between adjacent protrusions being about two millimeters. The length may be about twenty millimeters. The height may be about four millimeters and may be increased if desired to allow for more coil turns. Of course, the values given here are exemplary; many other configurations are possible.

Figure 7:
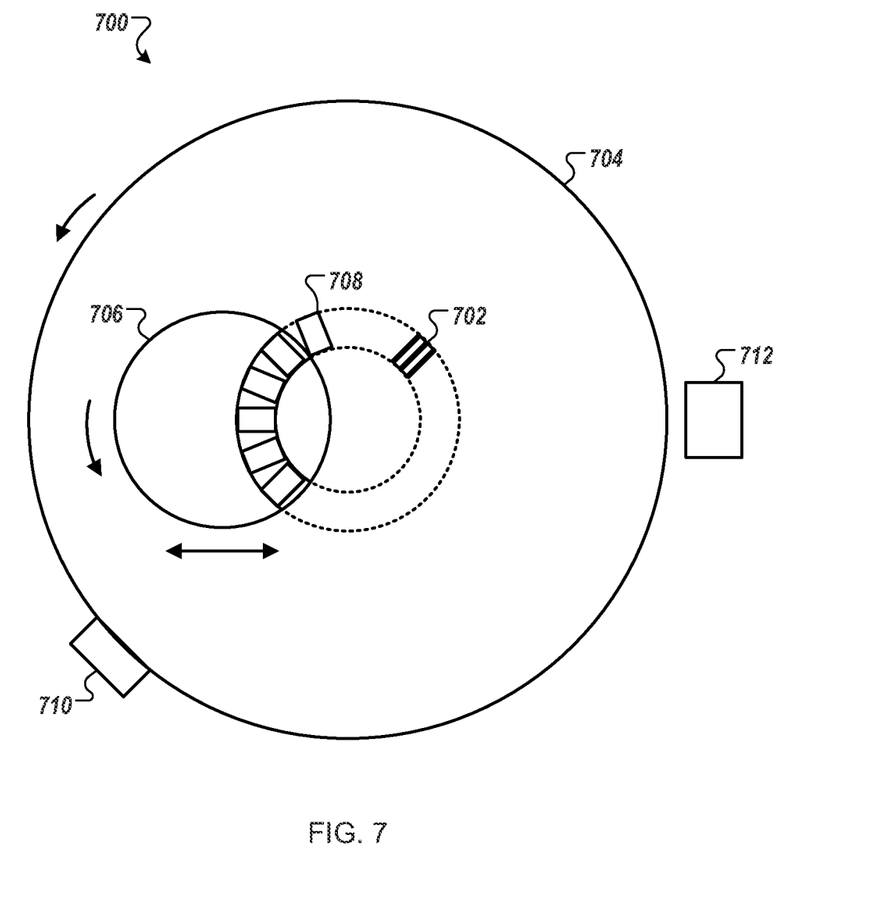
FIG. 7 shows a top view of a platen with a substrate on the surface of the platen.

In some implementations, the long axis of a core may not be exactly perpendicular to a radius of a substrate. However, a core may still provide improved resolution over available core geometries, particularly near the wafer edge. FIG. 7 shows a CMP system 700 in which an elongated core 702 is positioned underneath a platen 704. Prior to sweeping underneath a substrate 706, the core 702 is at a position 708. At the position 708, the core 702 is positioned approximately perpendicular to a radius R of substrate 706. Therefore, for r≈R, the portion of a conductive layer that couples with the magnetic field produced by the coil wound around the core 702 is generally at the same radial distance from the center of the wafer. Note that both the platen 704 and the substrate 706 are rotating as the core 702 sweeps beneath the substrate 706. The substrate 706 can also sweep with respect to the platen 704, as indicated. Additionally, a flag 710 and a flag sensor 712 may be used to sense the rotational position of the platen 704.

Figure 8A:
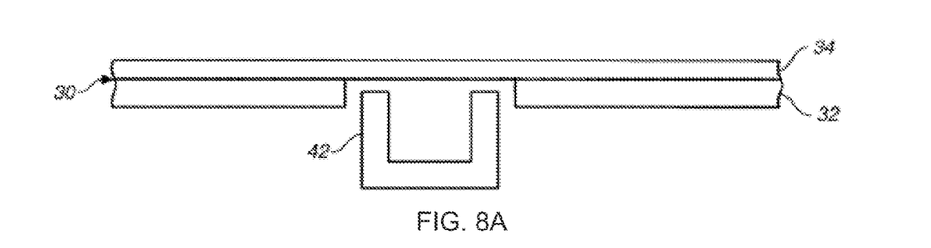
FIGS. 8A-8D schematically illustrate a method of detecting a polishing endpoint using an eddy current sensor.

Initially, referring to FIGS. 4 and 8A, before conducting polishing, the oscillator 50 is tuned to the resonant frequency of the LC circuit, without any substrate present. This resonant frequency results in the maximum amplitude of the output signal from RF amplifier 54.

Figure 8B:
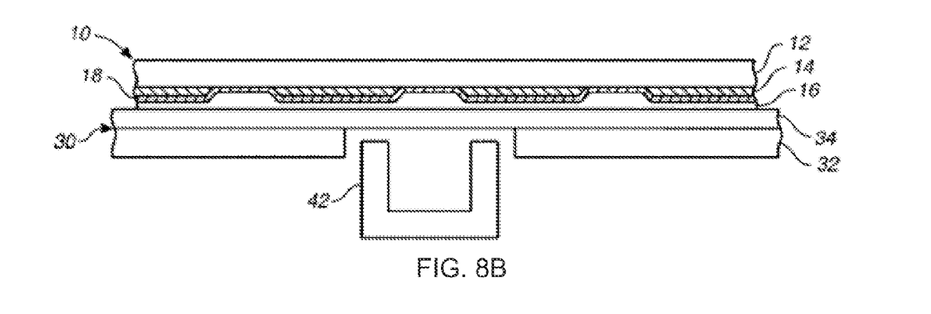

As shown in FIG. 8B, for a polishing operation, the substrate 10 is placed in contact with the polishing pad 30. The substrate 10 can include a silicon wafer 12 and a conductive layer 16, e.g., a metal such as copper, aluminum, cobalt, titanium, or titanium nitride disposed over one or more patterned underlying layers 14, which can be semiconductor, conductor or insulator layers. A barrier layer 18, such as tantalum or tantalum nitride, may separate the metal layer from the underlying dielectric. The patterned underlying layers 14 can include metal features, e.g., trenches, vias, pads and interconnects of copper, aluminum, or tungsten. Since, prior to polishing, the bulk of the conductive layer 16 is initially relatively thick and continuous, it has a low resistivity, and relatively strong eddy currents can be generated in the conductive layer. The eddy currents cause the metal layer to function as an impedance source in parallel with the sense coil 46 and the capacitor 52. Consequently, the presence of the conductive film 16 reduces the Q-factor of the sensor circuit, thereby significantly reducing the amplitude of the signal from the RF amplifier 56.

Figure 8C:
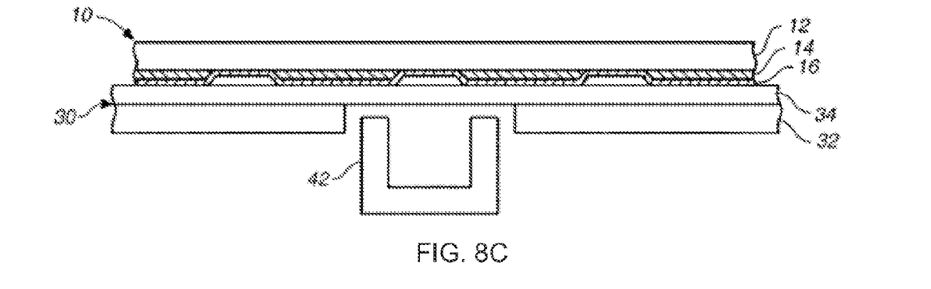

Referring to FIG. 8C, as the substrate 10 is polished the bulk portion of the conductive layer 16 is thinned. As the conductive layer 16 thins, its sheet resistivity increases, and the eddy currents in the metal layer become dampened. Consequently, the coupling between the conductive layer 16 and sensor circuitry is reduced (i.e., increasing the resistivity of the virtual impedance source). As the coupling declines, the Q-factor of the sensor circuit increases toward its original value, causing the amplitude of the signal from the RF amplifier 56 to rise.

Figure 8D:
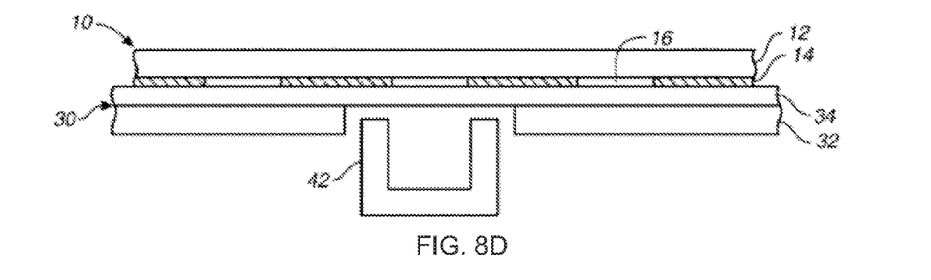

Referring to FIG. 8D, eventually the bulk portion of the conductive layer 16 is removed, leaving conductive interconnects 16' in the trenches between the patterned insulative layer 14. At this point, the coupling between the conductive portions in the substrate, which are generally small and generally non-continuous, and sensor circuit reaches a minimum. Consequently, the Q-factor of the sensor circuit reaches a target value (distinguishable from the Q-factor when the substrate is entirely absent). This causes a noticeable decrease in the rate of change in amplitude of the output signal from the sensor circuit.

Figure 9:
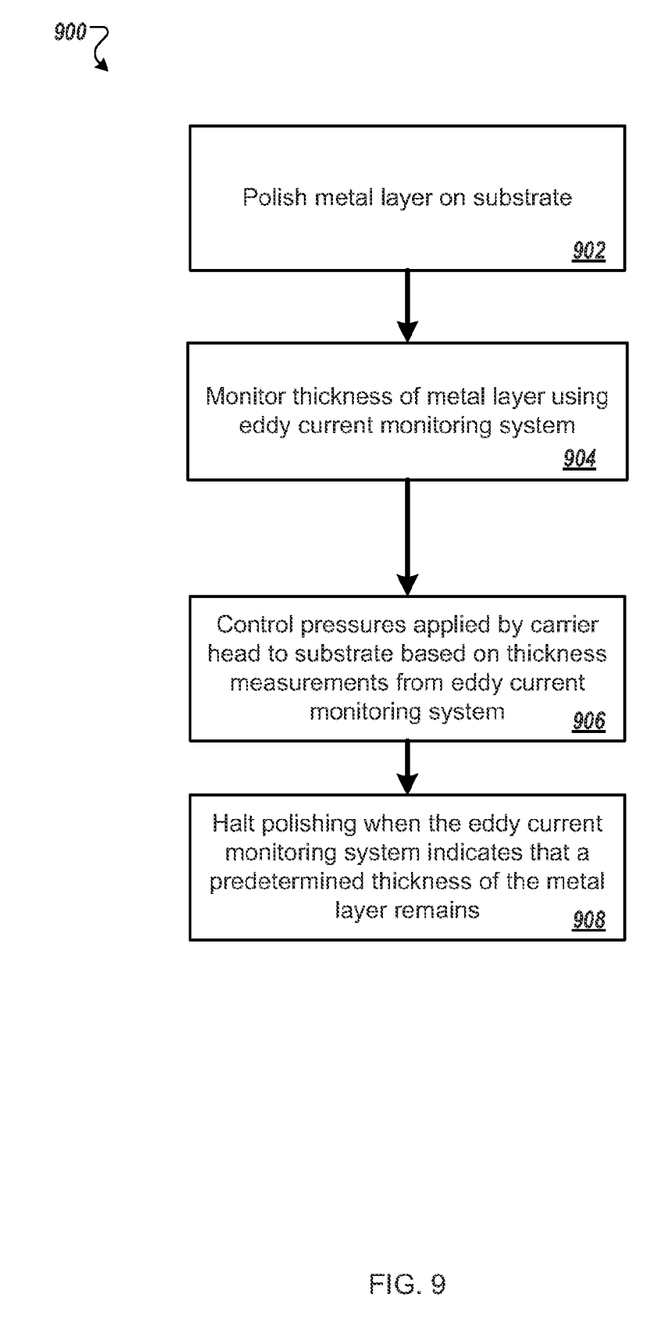
FIG. 9 is a flowchart illustrating a method of polishing a metal layer.

FIG. 9 shows an example flowchart of a process 900 for polishing a metal layer on a substrate. The metal layer can have a resistivity of 700 ohm Angstroms or more, e.g., 1500 ohm Angstroms or more, e.g., 2500 ohm Angstroms or more. The metal layer can have a resistivity less than 10000 ohm Angstroms. For example, the metal layer can be cobalt, titanium, or platinum, or a barrier metal, such as metallic titanium nitride. Before polishing, the metal layer can have a thickness between 1000 to 2000 Angstroms. The metal layer is polished at the polishing station (902). The eddy current monitoring system measures the thickness of the metal layer during polishing (904). The measurements can be fed into a closed-loop feedback system in order to control the pressure of the different chambers of the carrier head 70 on the substrate in order to polish the metal layer evenly (906). The eddy current monitoring system can have a resonant frequency greater than 12 MHz, e.g., of about 14 MHz to 16 MHz, e.g., 15 MHz. For polishing of some metal layers, e.g., cobalt, this can permit accurate measurement of the layer thickness below 2000 Angstroms, e.g., down to about 200 Angstroms. Thus, feedback control of the pressure can be performed down until the metal layer has a thickness of 200 to 300 Angstroms, at which point the polishing can be halted (908).

With the improved sensitivity of the eddy current sensor, closed-loop control of the pressure applied can be performed by the different chambers of the carrier head with greater reliability at thinner metal layer thicknesses for metals with lower resistivity, e.g., copper, aluminum, and tungsten. For such metals, the predetermined thickness level can be below 200 Angstroms, e.g., below 50 Angstroms, e.g., down to clearing detection or substantial removal of the metal layer.

In addition, the eddy current sensor can be used to detect whether there is metal residue remaining on the substrate and whether the underlying layer, e.g., an underlying barrier layer or underlying dielectric layer, has been completely exposed. Residue is metal of the metal layer still remaining over the underlying layer when the underlying layer has been substantially exposed, e.g., small unconnected spots of metal over the underlying layer (but not in the trench). This permits more accurate endpoint control and reduces the need for deliberate overpolishing. The metal residue can be residue of a metal with a resistivity less than 700 ohm Angstroms, e.g., copper, aluminum or tungsten. In some implementations, the metal is copper and the underlying layer is a barrier layer, e.g., Ti, TiN or TaN. In some implementations, the metal is a barrier layer metal, e.g., Ti, TiN or TaN, and the underlying layer is a dielectric layer. In such a case, the metal residue can be residue of a barrier layer metal with a resistivity greater than 700 ohm.

Figure 10:
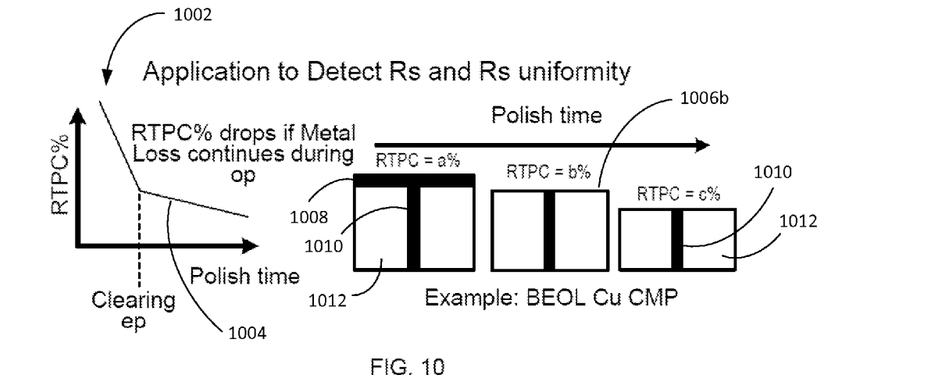
FIG. 10 is a graph and schematic illustrations of a method of polishing a metal layer.

Referring to FIG. 10, a graph 1002 shows the signal 1004 received from the eddy current sensor over time. The RTPC % axis represents a signal received from the eddy current sensor. A signal greater than the threshold value for air indicates the presence of a material conductive enough to be measured. Thus, at the start of the polishing process, the signal is high, as a layer 1008 of material being polished is thick. As the layer 1008 is polished and thinned, the signal drops, as indicated in the graph 1002. When the layer 1008 is cleared, as shown at step 1006b, the rate of change of the signal (i.e., the slope) changes, as indicated by the point marked "Clearing ep" in the graph 1002. The change in slope can be detected and used to determine that the layer 1008 is cleared.

As the substrate continues to be polished, the signal received indicates a thickness of a metal feature 1010 in an underlying layer 1012. The eddy current monitoring system can be used to continue polishing the layer 1012 and the metal feature 1010 until a predetermined thickness of the metal feature 1010 remains.

Figure 11:
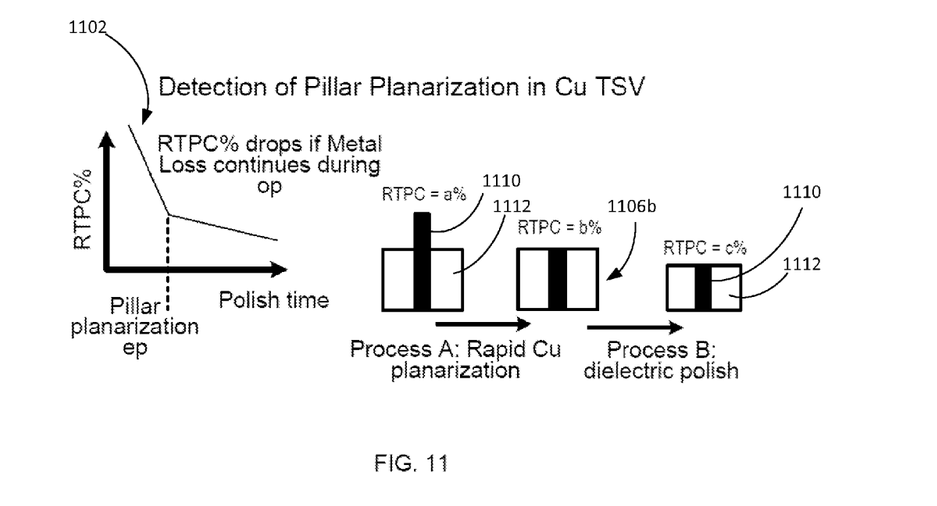
FIG. 11 is a graph and schematic illustrations of an alternative method of polishing a metal layer.

Referring to FIG. 11, a similar process can be used for detection of pillar planarization. By selecting an appropriate resonant frequency (which may need to be higher than 15 MHz) for the eddy current sensor, it may be possible to obtain a signal that depends on the thicknesses of metal pillars. A graph 1102 shows the signal received from the eddy current sensor over time. The change in the slope of the graph for pillar planarization indicates the planarization of the pillar, as shown in step 1106b. At this point, the pillar 1110 that had been protruding beyond the layer 1112 has been polished to a relatively similar level as the material of the layer 1112 surrounding the pillar 1110. In some implementations, the substrate can be polished at a first rate until the pillar 1110 is planarized, and a second rate to polish the layer 1112 and pillar 1110 after planarization to a predetermined thickness. For example, the first rate can be faster than the second rate, as the rate of change of the signal prior to planarization is greater prior to planarization. Therefore, changes in the signal can be more quickly detected. Once the point of planarization is reached, the second rate can be relatively slower, to provide more accurate endpoint control.

Figure 12:
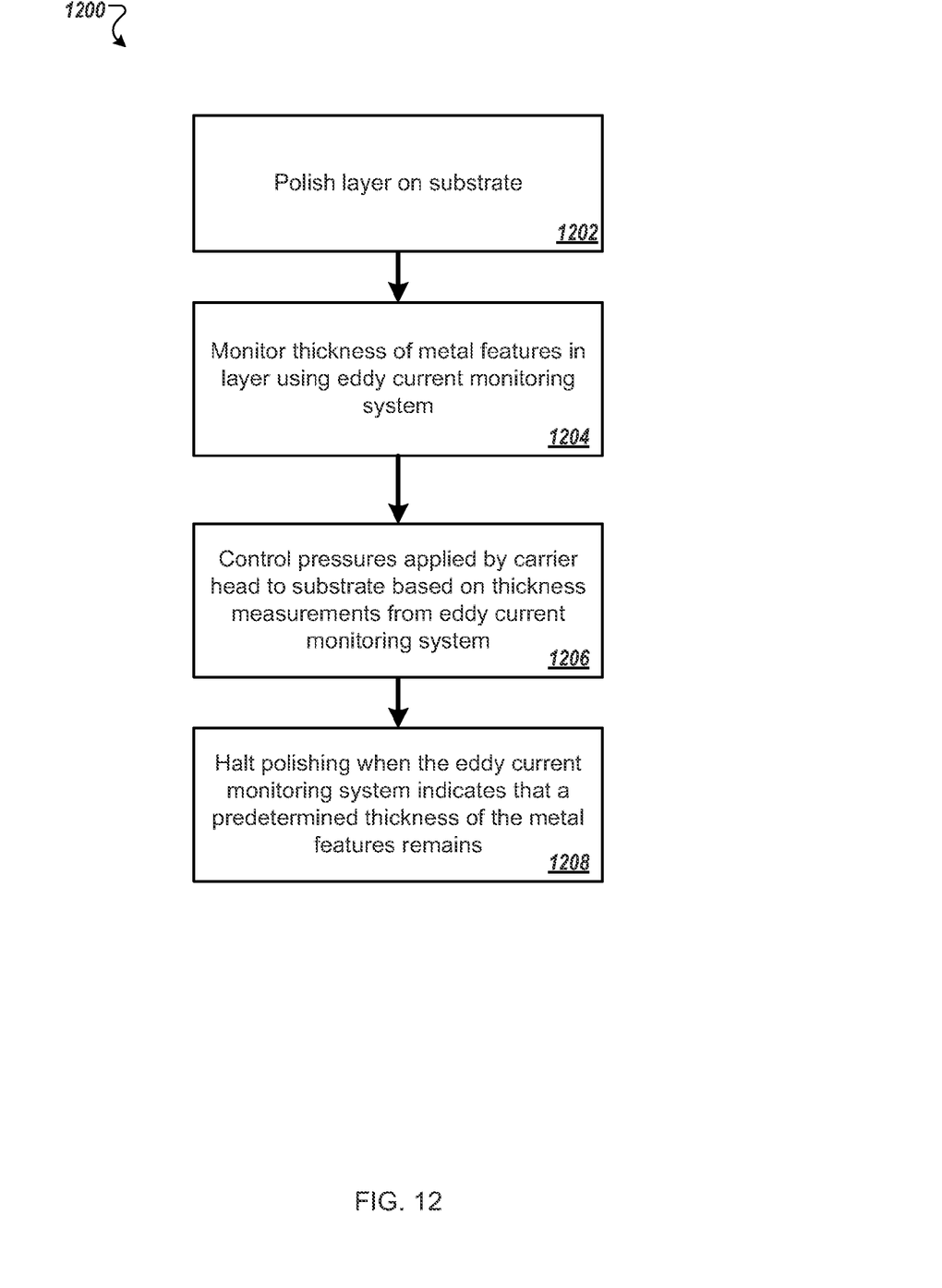
FIG. 12 is a flowchart illustrating an alternative method of polishing a metal layer.

FIG. 12 shows an example flowchart of an alternative process 1200 for polishing a layer on a substrate. With the improved sensitivity of the eddy current sensor, and with selection an appropriate resonant frequency (which may need to be higher than 15 MHz) it may be possible to measure the thicknesses of metal features, e.g., at least on some types of substrates, such as a substrate in a back-end-of-line process, e.g., a substrate with metal6 or metal7. This permits the substrate to be polished to a predetermined thickness of the metal features. The metal features are discrete separated metal features, e.g., metal inside trenches on the substrate or metal pillars extending above the planar surface of the underlying layer. The metal features can be a metal with a resistivity less than 700 ohm Angstroms, e.g., copper, aluminum or tungsten. The substrate is polished at the polishing station (1202), and the eddy current monitoring system is used to monitor the thickness of the metal features in the layer (1204). Optionally, the thickness of the metal features can be used to control pressures applied by the carrier head to the substrate (1206). The polishing can be halted when the eddy current monitoring system indicates that a predetermined thickness of the metal features remains (1208).

In some implementations, an overlying layer on top of the layer with metal features can first be cleared before polishing the layer with metal features, as described with reference to FIG. 10. For example, a metal layer can be deposited over a patterned underlying layer, with the metal on top of the underlying layer being the overlying layer and the metal in the trenches of the pattern providing the metal features. In some implementations, a change in rate of decrease of signal magnitude from the eddy current sensor can indicate a clearing of the overlying layer.

In some implementations, the process 1200 can be used for pillar planarization, as described above with reference to FIG. 11. For example, the layer can include copper pillars for vias, e.g., a through-silicon via. The metal features monitored by the eddy current sensor can be the copper pillars. Further, when the pillar is planarized, the rate of decrease in signal magnitude from the eddy current sensor can change. The layer and planarized pillar can then be further polished to a predetermined thickness indicated by the eddy current monitoring system.

The eddy current and optical monitoring systems can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad. Rather than tuning when the substrate is absent, the drive frequency of the oscillator can be tuned to a resonant frequency with a polished or unpolished substrate present (with or without the carrier head), or to some other reference.

Although illustrated as positioned in the same hole, the optical monitoring system 140 can be positioned at a different location on the platen than the eddy current monitoring system 40. For example, the optical monitoring system 140 and eddy current monitoring system 40 could be positioned on opposite sides of the platen, so that they alternately scan the substrate surface.

A number of embodiments of the invention have been described. Nevertheless, it will be understood that various modifications may be made without departing from the spirit and scope of the invention. Accordingly, other embodiments are within the scope of the following claims.

The invention claimed is:

1. An apparatus for chemical mechanical polishing, comprising:
  a platen having a surface to support a polishing pad; and
  an eddy current monitoring system to generate an eddy current signal, the eddy current monitoring system comprising a core positioned at least partially in the platen and a coil wound around a portion of the core, the core including
    a back portion,
    a first prong extending from the back portion in a first direction normal to the surface of the platen and having a width in a second direction parallel to the surface of the platen,
    second and third prongs extending from the back portion in parallel with the first prong, the second and third prongs positioned on opposite sides of and equidistant from the first prong and separated from the first prong along the second direction, wherein a width in the second direction of each of the second and third prongs is approximately equal to half the width in the second direction of the first prong,
    wherein the coil and core are configured to provide a resonant frequency of at least 12 MHz.

2. The apparatus of claim 1, wherein the coil and core are configured to provide a resonant frequency between about 14 and 16 MHz.

3. The apparatus of claim 1, wherein a spacing in the second direction between each of the second and third prongs and the first prong is approximately equal to two-thirds the width of the three prongs combined.

4. The apparatus of claim 3 wherein the first, second, and third prongs have a height equal to a spacing between the first and second prongs.

5. The apparatus of claim 4, wherein the height of the first, second, and third prongs is equal to a thickness of the back portion.

6. The apparatus of claim 1 wherein the coil is wound only around the first prong.

7. The apparatus of claim 6, wherein the coil is wound about 3 times around the first prong.

8. The apparatus of claim 7, wherein the eddy current monitoring system includes a capacitor in parallel with the coil, the capacitor having a capacitance of about 150 pF.

9. The apparatus of claim 1, wherein the core is made of nickel zinc ferrite.

10. An apparatus for chemical mechanical polishing, comprising:
  a platen having a surface to support a polishing pad; and
  an eddy current monitoring system to generate an eddy current signal, the eddy current monitoring system comprising a core positioned at least partially in the platen and a coil wound around a portion of the core, the core including
    a back portion,
    a first prong extending from the back portion in a first direction normal to the surface of the platen and having a width in a second direction parallel to the surface of the platen,
    second and third prongs extending from the back portion in parallel with the first prong, the second and third prongs positioned on opposite sides of and equidistant from the first prong and separated from the first prong along the second direction, wherein a width in the second direction of each of the second and third prongs is approximately equal to half the width in the second direction of the first prong.

11. The apparatus of claim 10, wherein a spacing in the second direction between each of the second and third prongs and the first prong is approximately equal to two-thirds the width of the three prongs combined.

12. The apparatus of claim 11, wherein the first, second, and third prongs have a height equal to a spacing between the first and second prongs.

13. The apparatus of claim 12, wherein a spacing in the second direction between each of the second and third prongs and the first prong is approximately equal to two-thirds the width of the three prongs combined.

* * * * *